US006835508B2

(12) United States Patent
Butschke et al.

(10) Patent No.: US 6,835,508 B2
(45) Date of Patent: Dec. 28, 2004

(54) LARGE-AREA MEMBRANE MASK AND METHOD FOR FABRICATING THE MASK

(75) Inventors: Jörg Butschke, Stuttgart (DE);
Albrecht Ehrmann, Krailling (DE);
Ernst Haugeneder, Vienna (AT);
Frank-Michael Kamm, Unterhaching (DE); Florian Letzkus, Tübingen (DE);
Hans Löschner, Vienna (AT);
Reinhard Springer, Sulz (DE)

(73) Assignees: Infineon Technologies AG, Munich (DE); IMS-Ionen Mikrofabrikations Systeme Ges.m.b.H., Vienna (AT)

( * ) Notice: Subject to any disclaimer, the term of this patent is extended or adjusted under 35 U.S.C. 154(b) by 160 days.

(21) Appl. No.: 10/215,227

(22) Filed: Aug. 8, 2002

(65) Prior Publication Data

US 2003/0031939 A1 Feb. 13, 2003

(30) Foreign Application Priority Data

Aug. 8, 2001 (DE) ......................................... 101 38 882

(51) Int. Cl.$^7$ ................................................. G03F 9/00
(52) U.S. Cl. ........................... 430/5; 430/323; 430/324; 378/34; 378/35; 250/492.21; 250/492.22; 250/492.23
(58) Field of Search ............................. 430/5, 323, 324; 378/34, 35; 250/492.21, 492.22, 492.23

(56) References Cited

U.S. PATENT DOCUMENTS

| 6,192,100 B1 | * | 2/2001 | Acosta et al. .................. 378/35 |
| 6,214,498 B1 | | 4/2001 | Choi |
| 6,613,483 B2 | * | 9/2003 | Fujimoto ....................... 430/5 |

FOREIGN PATENT DOCUMENTS

WO      WO 99/49365       9/1999

* cited by examiner

*Primary Examiner*—Geraldine Letscher
(74) *Attorney, Agent, or Firm*—Laurence A. Greenberg; Werner H. Stemer; Ralph E. Locher

(57) ABSTRACT

In order to increase the rigidity of a membrane mask that can be used for ion projection lithography, a second wafer made of the material of the membrane layer is provided in addition to a first wafer. The second wafer is patterned in the same way as the first wafer to form a second carrying ring and is fitted on the membrane layer in a mirror-inverted manner with respect to the first wafer so that the membrane area is arranged between the first and second carrying rings in a centered manner in the direction perpendicular to the membrane plane.

6 Claims, 3 Drawing Sheets

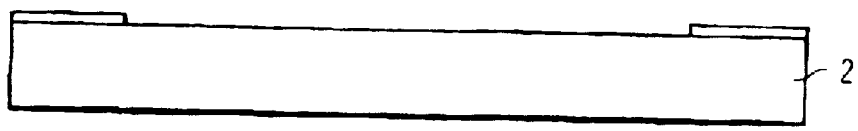
FIG. 3A
FIG. 3B
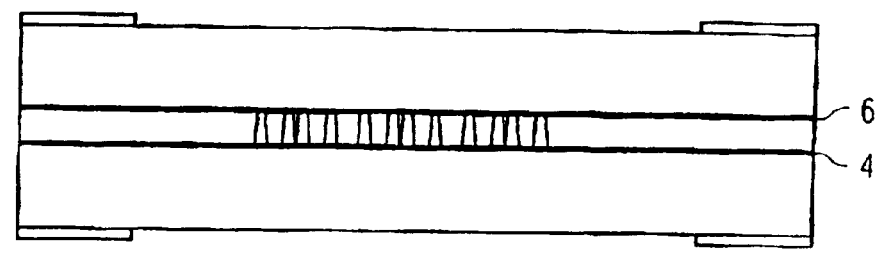
FIG. 3C
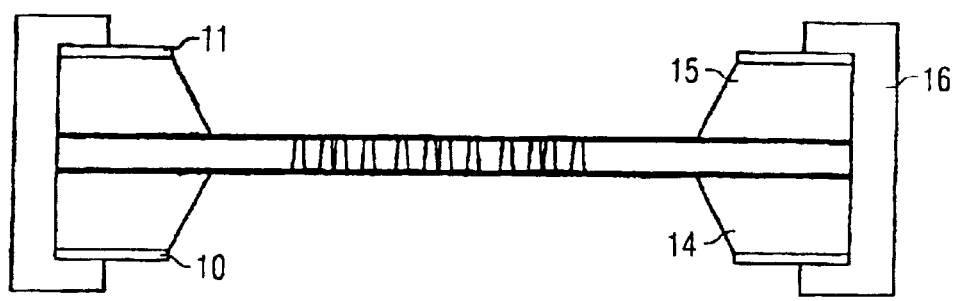
FIG. 3D
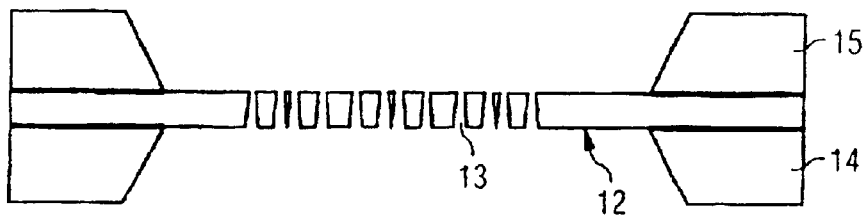

LARGE-AREA MEMBRANE MASK AND METHOD FOR FABRICATING THE MASK

BACKGROUND OF THE INVENTION

Field of the Invention

The invention relates to a large-area membrane mask for lithography methods with short-wave radiation, in particular for ion projection lithography, and to a method for fabricating such a membrane mask.

In semiconductor technology, nowadays the silicon wafers are patterned almost without exception by using the lithographic technique, in which first a resist pattern is produced on the wafer in a radiation-sensitive resist layer. This pattern then serves as a mask during a subsequent process step, e.g. an etching. Afterward, the resist mask is removed again. The resist pattern itself is likewise fabricated using a mask that is suitable for the respective exposure method. For this, conventional photolithography uses chromium masks (reticles) which include a glass plate as a carrier and a thin patterned chromium layer. Masks for X-ray lithography only allow mask carrier thicknesses in the micrometers range, however, even when weakly absorbing materials such as silicon are used. This is realized by membrane masks including a central active region, in which they are thinned toward the membrane, and a supporting edge (carrying ring) in the original thickness of the silicon substrate. A geometrically patterned absorber layer is fitted on the membrane layer in the case of X-ray masks.

Electron and ion lithography often use membrane masks in which the mask openings are produced in the membrane layer rather than on it. The membrane layer, which has a thickness in the micrometers range, contains mask openings or holes corresponding to the figures or patterns that will be produced lithographically. Consequently, such so-called perforated masks (stencil masks) are mechanically comparatively unstable structures, as in the case of all membrane masks.

For electron and ion projection lithography and recent versions of X-ray lithography, it is necessary to fabricate membrane masks with thicknesses in the micrometers range and with membrane areas having a size of up to more than 100 square centimeters. The membrane mask produced by the method according to the invention can generally be employed for lithography methods using charged particles and using photons. One exemplary use is in 13 nm lithography (so-called EUV beams). Another possible use is for masking with respect to neutral particles (atom lithography) and in all applications with a vapor deposition mask. Membrane masks as a product of a method according to the present invention can also generally be used for sensors.

Proceeding from silicon wafers as a typical substrate material, two different technological process variants have been followed heretofore for fabricating the membrane masks. They differ in principle with respect to whether the process steps for mask patterning, that is to say for perforation, are effected before (wafer flow process) or after (membrane flow process) the membrane etching, that is to say the removal of the wafer except for the remaining carrying ring.

In the so-called wafer flow process, as is presented, for example, in International Publication WO 99/49365, first the mask structures are produced on a compact silicon wafer and the membrane (area) is fabricated by etching the rear side of the substrate at the end of the process. This process variant makes it possible, on the one hand, to carry out the patterning processes for the mask structures on stable wafers whose processing can be better controlled. On the other hand, in this variant, very stringent requirements are also made of the membrane etching process, since the patterned membrane side must be absolutely securely protected against an etching attack. A boron doping of the membrane layer has conventionally been provided as an etching stop technique, as a result of which, however, conditions that are not defined exactly enough often result.

Therefore, SOI (Silicon-On-Insulator) substrates have also recently been used as is described in International Publication WO 99/49365. In this case, the buried oxide layer in the SOI wafer serves as a defined etching stop and the doping of the membrane layer can be chosen as desired according to other standpoints. Proceeding from a semiconductor/insulator/semiconductor carrier layer substrate, the future structure of the membrane is transferred into the topmost semiconductor layer; that is to say, into the future membrane layer. In a further step, the semiconductor carrier layer is removed from the underside except for an outer ring. Finally, in the central region, the uncovered insulator layer is also removed, with the result that the semiconductor layer bearing on the carrying ring with its uncovered central region clamped by the carrying ring represents the patterned membrane area.

In the future a positional accuracy in the region of a few nanometers will be demanded on the position of the structures that are introduced into the membrane and that are crucial for the function of the mask. In this case, depending on the desired inherent stress of the membrane layer, it is necessary first to take account of a more or less pronounced homogeneous displacement of the mask structures with respect to the original position, which, however, can be compensated for by precorrection. What are significantly more problematic are process- and storage-dictated distortions which, on account of the size of the membrane area (diameter typically 126 millimeters or more) and the low rigidity of the mask, greatly influence the positioning accuracy.

Stresses that can lead to distortions occur particularly in connection with SOI substrates. This is because of various reasons dictated by their construction or fabrication process. By way of example, the fabrication of buried oxide layers using wafer bonding is often accompanied, in practice, by mechanical irregularities which are manifested in inhomogeneous stresses in the upper, thin semiconductor layer.

The aforementioned carrying ring made of membrane material (typically silicon) has been used heretofore for stabilizing the membrane area. The carrying ring concentrically surrounds the membrane area and has a significantly larger thickness than the membrane. This mask geometry has usually been realized with an SOI wafer whose thickness on the membrane area has been reduced to a few micrometers by etching methods. The stabilization ring retains the original wafer thickness of a few hundred micrometers. Despite this stabilization, the rigidity of the overall system is not high enough to reduce the distortions that occur to the demanded order of magnitude that is indispensable for future use.

U.S. Pat. No. 6,214,498 B1 discloses a double-story membrane mask, which is constructed from two perforated membrane layers and the associated carrying rings, and a method for fabricating it. The starting point is the problem that the energy of the high-energy particles which is absorbed in the mask during the exposure operation leads to a thermal expansion, as a result of which a mask warpage occurs that can lead to unacceptable distortions during the imaging of the mask structures. In order to eliminate these thermal distortions triggered by the exposure itself, it is proposed to place two essentially mirror-symmetrical masks one on top of the other and to provide, in the region of the carrying rings, an intermediate piece which, on the one hand, mechanically connects the two masks but, on the other hand, thermally insulates them from one another. As a result, the thermal energy is absorbed in the upper mask near the radiation. The mask warpage of which does not influence the imaging, however, since its openings are somewhat larger than those of the lower mask, in which no mask warpage occurs on account of its shielding and insulation.

This known double mask is fabricated by patterning the two masks including the intermediate piece one beside the other on a conventional silicon wafer, which is subsequently divided into the two masks. The two masks are then fixed to one another in a mirror-inverted manner by using a conductive layer.

SUMMARY OF THE INVENTION

It is accordingly an object of the invention to provide a membrane mask which reduces the aforementioned problems with process and storage-dictated distortions and a method for fabricating the membrane mask which enables the membrane mask to be fabricated with small distortions in particular when using an SOI substrate.

With the foregoing and other objects in view there is provided, in accordance with the invention, a large-area membrane mask for lithography methods using particle or short-wave radiation. The membrane mask includes: a membrane layer formed with continuous openings defining a mask pattern; and a first wafer made of a membrane material. The first wafer has a front surface and a rear surface. The membrane layer is configured on the front surface. The first wafer has a well-type depression extending from the rear surface to the front surface and forming a membrane area and a first carrying ring concentrically surrounding the membrane area. The membrane mask also includes a second wafer made of a membrane material that is patterned identical to the first wafer to form a second carrying ring. The second wafer is fitted on the membrane layer in a mirror-inverted manner with respect to the first wafer. The membrane area defines a plane and is configured between the first carrying ring and second carrying ring in a centered manner in a direction perpendicular to the plane.

In accordance with an added feature of the invention, there is provided, an SOI wafer having a semiconductor layer, an insulator layer, and a semiconductor carrier layer. The semiconductor layer forms the membrane layer. The semiconductor carrier layer forms the first wafer. The second semiconductor wafer is a solid wafer and has a surface facing the membrane layer. The surface of the second semiconductor wafer has an etching stop layer.

With the foregoing and other objects in view there is provided, in accordance with the invention, a method for fabricating the large-area membrane mask, which includes steps of: patterning and trench etching the mask pattern into the membrane layer of the SOI wafer as far as the insulation layer; applying a masking layer to a rear side of the SOI wafer and to a rear side of the second wafer that are patterned by a lithographic masking and a subsequent etching in each case to form a membrane window; joining together the SOI wafer that has been patterned and the second wafer in a wafer bonding step such that the surface of the second semiconductor wafer that has the etching stop layer is brought into contact with the membrane layer of the SOI wafer; subsequently etching a membrane in the membrane window defined by the masking layer by removing the semiconductor carrier layer of the SOI wafer as far as the insulating layer and semiconductor material of the second wafer as far as the etching stop layer; and after etching the membrane, removing the masking layer, and of parts of the insulating layer and the etching stop layer that are uncovered on the membrane area.

In accordance with an added mode of the invention, the method includes a step of: etching the membrane by performing a simultaneous wet etching on both sides in a mechanically sealed etching cell.

The basic concept of the invention consists in providing a double ring geometry, by means of which a considerable additional stabilization is achieved compared with the previously known membrane masks with a single carrying ring, since the rigidity of the overall system is significantly increased. What is crucial here is the fact that, in this double ring geometry, the membrane lies, in the vertical direction, in the center of the two carrying or stabilization rings, and thus runs near the "neutral axis". The vertical centering results in canceling out the vertical process-induced distortions, which result from the etching-free of the membrane, in the membrane plane, since they have the same magnitude, but an opposite sign, above and below the membrane area. Moreover, this arrangement of the membrane significantly reduces, and ideally completely suppresses, the fixing-induced distortions of the mask on account of the smaller vertical deflection.

In one preferred embodiment, a membrane mask is provided by virtue of the fact:

- a semiconductor/insulator/semiconductor carrier layer wafer (SOI wafer) is provided, whose semiconductor layer forms the membrane layer and whose semiconductor carrier layer forms the first wafer; and
- the membrane-side surface of the second, solid semiconductor wafer has an etching stop layer.

This opens up the possibility of specifying, proceeding from an SOI wafer, a method for fabricating a membrane mask of this type, having the following steps:

- patterning and trench etching the mask pattern into the membrane layer of the SOI wafer as far as the insulation layer;
- applying a masking layer to the rear sides of the SOI wafer and of the second wafer, which is patterned by lithographic masking and subsequent etching in each case to form a membrane window;
- joining together the SOI wafer thus prepared and the second wafer in a wafer bonding step, the front side—provided with an etching stop layer—of the second wafer being brought into contact with the patterned membrane layer of the SOI wafer;
- subsequently etching a membrane by removing the semiconductor carrier layer of the SOI wafer as far as the insulating layer and the semiconductor material of the second wafer as far as the etching stop layer in the membrane windows defined by the respective masking layer; and
- after the membrane etching, removing the masking layers, and those parts of the insulating layer and of the etching stop layer that are uncovered on the membrane area.

A particularly advantageous refinement of this method provides for the membrane etching to be effected by simultaneous wet etching on both sides in a mechanically sealed etching cell. If, on the other hand, dry etching steps are intended to be used for the membrane etching, non-simultaneous substeps may be more favorable. What is always crucial is that the symmetry and hence the stability of the resulting membrane mask is ensured.

Other features which are considered as characteristic for the invention are set forth in the appended claims.

Although the invention is illustrated and described herein as embodied in a large-area membrane mask and method for fabricating it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 3A to 3D show substeps of an inventive method, in which the two wafers prepared in accordance with FIGS. 1 and 2 are jointly subjected to further processing.

DESCRIPTION OF THE PREFERRED EMBODIMENTS

Figure 1A:
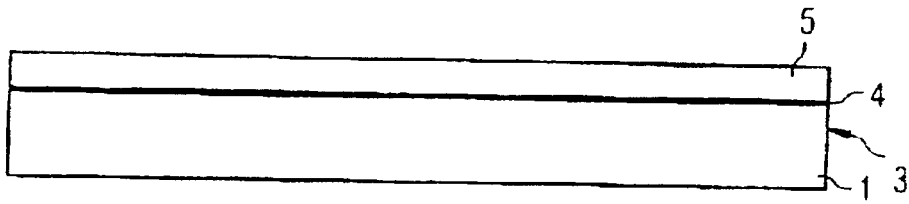
FIGS. 1A–1E show successive substeps of an inventive method to process an SOI wafer.

Referring now to the figures of the drawing in detail and first, particularly, to FIG. 1A thereof, the starting point is shown. FIG. 1A shows a finished SOI substrate 3 having a semiconductor carrier layer that serves as a first wafer 1 and that carries the upper, thin semiconductor layer, namely the membrane layer 5. A buried layer is situated in between, which layer is intended to subsequently serve as an etching stop layer and which is hereinafter designated as the "insulator layer" 4—following the customary terminology ("SOI wafer").

Figure 1B:
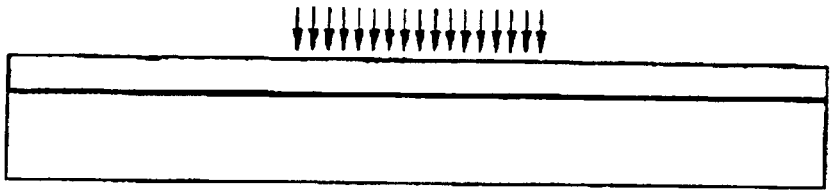

FIG. 1B shows the next substep in which, the mechanical prestress of the later membrane area 12 (See FIG. 3D) is set by the whole-area implantation of ions, for example boron, into the upper membrane layer 5. This measure, known per se, primarily serves for mechanically stabilizing the membrane area 12, which, however, in the finished membrane mask, is also intended to be slightly tensioned because vertical sagging would have an unfavorable distortion effect.

Figure 1C:
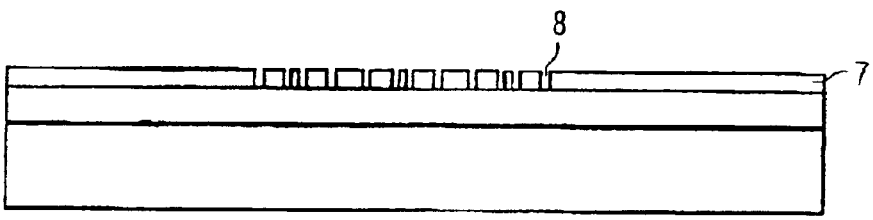

In the next substep shown in FIG. 1C, a resist layer 7 is applied to the top side of the SOI substrate 3. The hole pattern 8 that can be discerned in FIG. 1C is produced in the resist layer by using electron lithography.

Figure 1D:
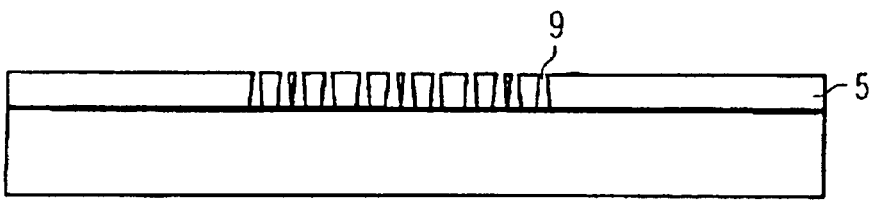

In the next substep shown in FIG. 1D, trenches 9 are etched in the membrane layer 5 by using the previously applied and patterned resist layer 7. These trenches 9 are provided for the later mask openings 13 (See FIG. 3D). The resist layer 7 is subsequently removed.

Figure 1E:
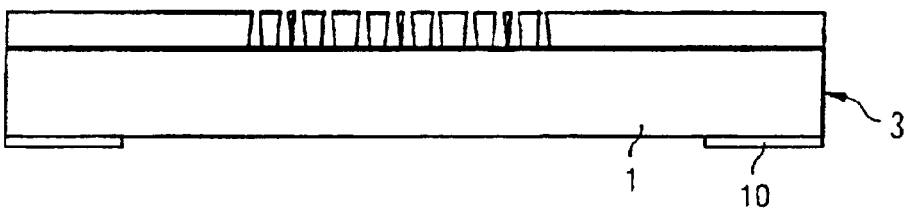

In a further substep shown in FIG. 1E, a masking layer 10 made of silicon nitride, is applied to the rear side of the SOI substrate 3 for the later rear-side processes and is patterned lithographically to form a membrane window.

Figure 2A:
FIGS. 2A–2C show successive substeps of an inventive method to process a conventional wafer.
Figure 2B:
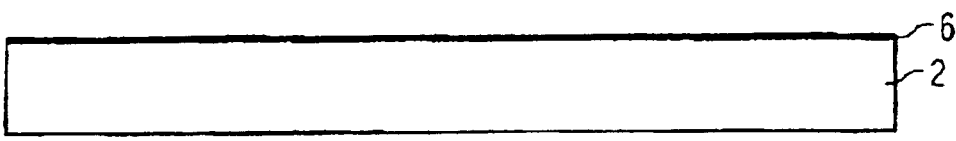
Figure 2C:
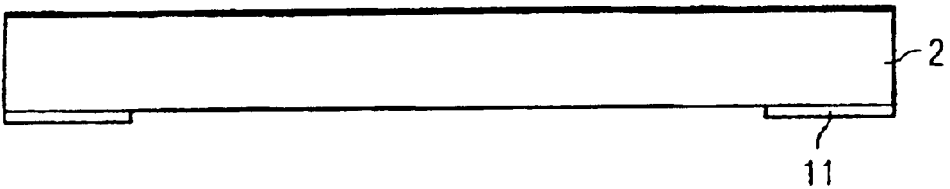

FIG. 2A shows a conventional silicon wafer 2 that is used as the starting point. In the substep shown in FIG. 2B, the front side of the wafer is provided with an oxide layer which is subsequently intended to serve as an etching stop layer 6, analogously to the insulation layer 4. In accordance with the process step shown in FIG. 2C, a silicon nitride masking layer 11 is subsequently applied to the rear side of the second wafer 2 for the later rear-side processes in the case of this wafer and is likewise patterned lithographically to form a membrane window. The second wafer 2 remains unpatterned—that is to say without openings, at its front side, since it is not intended to form an independent perforated mask.

FIG. 3A shows the starting point in which the first wafer 1 and the second wafer 2 have been provided. The first wafer 1 and the second wafer 2 have been preprocessed in the manner described above. The wafers 1 and 2 are arranged mirror-symmetrically with regard to the membrane layer 5, which forms the central plane.

In the next substep shown in FIG. 3B, the two prepared wafers 1, 2 are joined together in the configuration illustrated by using wafer bonding. This is done in a manner known per se, for example, by joining together the opposite areas and applying subsequent heating. After the heating, during which a permanent chemical bond is produced between the second wafer 2 and the membrane layer 5 associated with the SOI substrate 3, the interface is cooled following a predetermined time duration.

In the subsequent substep shown in FIG. 3C, the structure produced after the wafer bonding is inserted into a mechanically sealed etching cell 16. The size of the future membrane area 12 is defined from both sides through the opening of the membrane windows in accordance with the patterned masking layers 10, 11. The etching process can now be carried out using the wet-chemical etchants known per se, in which case the oxide layer 6, from the side of the second wafer 2, and the insulator layer 4, from the side of the SOI wafer 3, serve as an etching stop with good selectivity. Moreover, the sensitive stencil structures are thus protected during the membrane etching. The wet etching is advantageously effected simultaneously from both sides in the etching cell 16, but it can equally well be effected in separate etching steps—that is to say in particular in temporal succession. According to the invention, dry etching steps are also possible during the membrane etching.

In the final substep shown in FIG. 3D, the masking layers 10, 11 and those parts of the insulating layer 4 and of the oxide layer 6 which are uncovered on the membrane area 12 are removed, for example, by dry etching steps. The result is the free membrane area 12 with the mask openings 13 that is supported by the double ring construction according to the invention.

In an advantageous manner, the two carrying rings 14, 15 have essentially the same thickness of a few hundred micrometers and are produced from the same material, so that as far as possible symmetrical conditions are afforded.

With regard to the free membrane area 12, which forms the central plane between the two carrying rings 14, 15, similar conditions prevail to those in the case of the neutral axis within a bar, which neutral axis, as is known, is subjected to relatively little bending loading. In the vertical direction, that is to say in the direction perpendicular to the membrane plane, the process- and storage-dictated deflections and thus the corresponding disadvantageous distortions are therefore minimized according to the invention. The membrane masks according to the invention can be produced, for example, with 150 mm or with 200 mm wafers and are preferably used for full-field exposure in semiconductor fabrication. During the exposure using electron or ion beams, for example, the mask openings 13 can, in a known manner, define the mask pattern to be transferred to a radiation-sensitive resist layer.

We claim:

1. A large-area membrane mask for lithography methods using particle or short-wave radiation, comprising:
    a membrane layer formed with continuous openings defining a mask pattern;
    a first wafer made of a membrane material, said first wafer having a front surface and a rear surface, said membrane layer configured on said front surface, said first wafer having a well-type depression extending from said rear surface to said front surface and forming a membrane area and a first carrying ring concentrically surrounding said membrane area; and
    a second wafer made of a membrane material being patterned identical to said first wafer to form a second carrying ring;
    said second wafer being fitted on said membrane layer in a mirror-inverted manner with respect to said first wafer; and
    said membrane area defining a plane and being configured between said first carrying ring and second carrying ring in a centered manner in a direction perpendicular to said plane.

2. The membrane mask according to claim 1, comprising:
    an SOI wafer having a semiconductor layer, an insulator layer, and a semiconductor carrier layer;
    said semiconductor layer forming said membrane layer;
    said semiconductor carrier layer forming said first wafer;
    said second semiconductor wafer being a solid wafer and having a surface facing said membrane layer; and
    said surface of said second semiconductor wafer having an etching stop layer.

3. A method for fabricating the large-area membrane mask according to claim 2, which comprises:
    patterning and trench etching the mask pattern into the membrane layer of the SOI wafer as far as the insulation layer;
    applying a masking layer to a rear side of the SOI wafer and to a rear side of the second wafer that are patterned by a lithographic masking and a subsequent etching in each case to form a membrane window;
    joining together the SOI wafer that has been patterned and the second wafer in a wafer bonding step such that the surface of the second semiconductor wafer that has the etching stop layer is brought into contact with the membrane layer of the SOI wafer;
    subsequently etching a membrane in the membrane window defined by the masking layer by removing the semiconductor carrier layer of the SOI wafer as far as the insulating layer and semiconductor material of the second wafer as far as the etching stop layer; and
    after etching the membrane, removing the masking layer, and of parts of the insulating layer and the etching stop layer that are uncovered on the membrane area.

4. The method according to claim 3, which comprises: etching the membrane by performing a simultaneous wet etching on both sides in a mechanically sealed etching cell.

5. A large-area membrane mask for ion projection lithography, comprising:
    a membrane layer formed with continuous openings defining a mask pattern;
    a first wafer made of a membrane material, said first wafer having a front surface and a rear surface, said membrane layer configured on said front surface, said first wafer having a well-type depression extending from said rear surface to said front surface such that a membrane area and a first carrying ring concentrically surrounding said membrane area are formed; and
    a second wafer made of a membrane material being patterned identical to said first wafer to form a second carrying ring;
    said second wafer being fitted on said membrane layer in a mirror-inverted manner with respect to said first wafer; and
    said membrane area defining a plane and being configured between said first carrying ring and second carrying ring in a centered manner in a direction perpendicular to said plane.

6. A large-area membrane mask for lithography methods using particle or short-wave radiation, comprising:
    a membrane layer formed with continuous openings defining a mask pattern;
    a first wafer made of a membrane material, said first wafer having a front surface and a rear surface, said membrane layer configured on said front surface, said first wafer having a well-type depression extending from said rear surface to said front surface and forming a membrane area and a first carrying ring concentrically surrounding said membrane area; and
    a second wafer made of a membrane material being patterned identical to said first wafer to form a second carrying ring;
    said second wafer being fitted on said membrane layer in a mirror-inverted manner with respect to said first wafer; and
    said membrane area defining a plane and being configured between said first carrying ring and second carrying ring in a centered manner in a direction perpendicular to said plane, said first carrying ring and said second carrying ring having substantially the same thickness.

\* \* \* \* \*